US012563695B2

(12) United States Patent
Wu

(10) Patent No.: US 12,563,695 B2
(45) Date of Patent: Feb. 24, 2026

(54) ELECTRONIC DEVICE AND HEAT DISSIPATION METHOD THEREFOR

(71) Applicants: INVENTEC (PUDONG) TECHNOLOGY CORPORATION, Shanghai (CN); INVENTEC CORPORATION, Taipei (TW)

(72) Inventor: Guo-Ping Wu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 420 days.

(21) Appl. No.: 18/372,702

(22) Filed: Sep. 26, 2023

(65) Prior Publication Data

US 2024/0414878 A1     Dec. 12, 2024

(30) Foreign Application Priority Data

Jun. 12, 2023    (CN) .......................... 202310694532.9

(51) Int. Cl.
*H05K 7/20* (2006.01)
*G05D 23/19* (2006.01)

(52) U.S. Cl.
CPC ..... *H05K 7/20209* (2013.01); *H05K 7/20909* (2013.01); *G05D 23/1931* (2013.01); *G05D 23/1932* (2013.01)

(58) Field of Classification Search
CPC ........... H05K 7/20909; H05K 7/20836; H05K 7/20209; H05K 7/20727; G05D 23/1931; G05D 23/1932; G05D 23/1934
See application file for complete search history.

(56) References Cited

U.S. PATENT DOCUMENTS

| | | | |
|---|---|---|---|
| 2013/0045114 A1* | 2/2013 | Chang .................... | F04D 25/166 |
| | | | 417/45 |
| 2013/0344794 A1* | 12/2013 | Shaw ................. | H05K 7/20836 |
| | | | 454/258 |
| 2015/0208552 A1* | 7/2015 | Mornan ............. | H05K 7/20745 |
| | | | 165/252 |
| 2022/0147125 A1* | 5/2022 | Huai ...................... | F04D 29/582 |

* cited by examiner

*Primary Examiner* — Nicholas Klicos

(57) ABSTRACT

Disclosed is a heat dissipation method for an electronic device. The electronic device includes a first fan and a power supply unit. The first fan generates airflow through the device. The power supply unit includes a second fan which generates airflow through the power supply unit. A speed of the first fan is controlled by a first current control data. A speed of the second fan is controlled by a second current control data. The control data of the first fan is determined according to the temperature control of electronic components of the server. The control data of the second fan is determined by considering that air backflow is generated in the power supply unit. The control data of the second fan is further determined by feeding back the control data of the first fan to the power supply unit and considering temperature control of the power supply unit.

16 Claims, 2 Drawing Sheets

ELECTRONIC DEVICE AND HEAT DISSIPATION METHOD THEREFOR

CROSS-REFERENCE TO RELATED DISCLOSURES

This application claims priority to Chinese patent application No. 2023106945329 filed with the Chinese Patent Office on Jun. 12, 2023, entitled "HEAT DISSIPATION METHOD FOR SERVER", the entire contents of which are incorporated by reference.

TECHNICAL FIELD

The present disclosure relates to the computer technologies, and in particular, to an electronic device and a heat dissipation method therefor.

BACKGROUND

Electronic components inside a server will generate heat during operation. If proper heat dissipation is not performed, the increased temperature will affect the performance of the electronic components. Therefore, a fan is usually provided in the server to generate airflow within the chassis to cool the electronic components by thermal convection. In addition, since the power supply unit is a high-power module, an individual fan may be provided for the power supply unit of the existing server to dissipate heat directly from the power supply unit.

SUMMARY

Some embodiments of the present disclosure provide a heat dissipation method for an electronic device. The electronic device includes at least one first fan and at least one power supply unit. The at least one first fan generates an airflow passing through the electronic device. The at least one power supply unit includes a second fan, and the second fan generates an airflow passing through the at least one power supply unit. A speed of the first fan is controlled according to a first current control data, and a speed of the second fan is controlled according to a second current control data. The method includes:

detecting a first airflow temperature at a first air inlet of the electronic device and a second airflow temperature at a first air outlet of the electronic device;

determining a first control data according to the first airflow temperature and the second airflow temperature;

detecting operating temperatures of electronic components of the at least one power supply unit of the electronic device;

determining a second control data according to the first control data and a first increment if the operating temperatures of the electronic components are within a first predetermined range;

determining the second control data as a first next-stage control data of the at least one first fan, such that, when the speed of the at least one first fan is controlled by the first next-stage control data, a third airflow temperature at a second air inlet of the at least one power supply unit is lower than a fourth airflow temperature at a second air outlet of the at least one power supply unit;

detecting the third airflow temperature at the second air inlet of the at least one power supply unit and the fourth airflow temperature at the second air outlet of the at least one power supply unit;

determining a third control data according to the second current control data and a second increment if the third airflow temperature at the second air inlet of the at least one power supply unit is within a second predetermined range;

determining a fourth control data according to the second control data and the third control data;

determining the fourth control data as a second next-stage control data of the at least one second fan, such that, when a speed of the at least one second fan is controlled by the second next-stage control data, the third airflow temperature at the second air inlet of the at least one power supply unit is lower than the fourth airflow temperature at the second air outlet of the at least one power supply unit.

In another aspect, the present disclosure further provides an electronic device. The electronic device includes at least one first fan and at least one power supply unit. The at least one first fan generates an airflow passing through the electronic device. The at least one power supply unit includes a second fan, and the second fan generates an airflow passing through the at least one power supply unit. A speed of the first fan is controlled according to a first current control data, and a speed of the second fan is controlled according to a second current control data. The electronic device further includes a control chip, and the control chip is configured to execute the heat dissipation method for the electronic device as described above.

The present disclosure will be more concise and understandable in the following description.

BRIEF DESCRIPTION OF THE DRAWINGS

In order to illustrate the technical solutions in the embodiments of the present disclosure more clearly, the accompanying drawings used in the description of the embodiments or prior art will be briefly introduced below. Apparently, the accompanying drawings in the following description are only some embodiments of the present disclosure. For those of ordinary skill in the art, other drawings can also be derived from these drawings without creative effort.

DETAILED DESCRIPTION OF THE EMBODIMENTS

Figure 1:
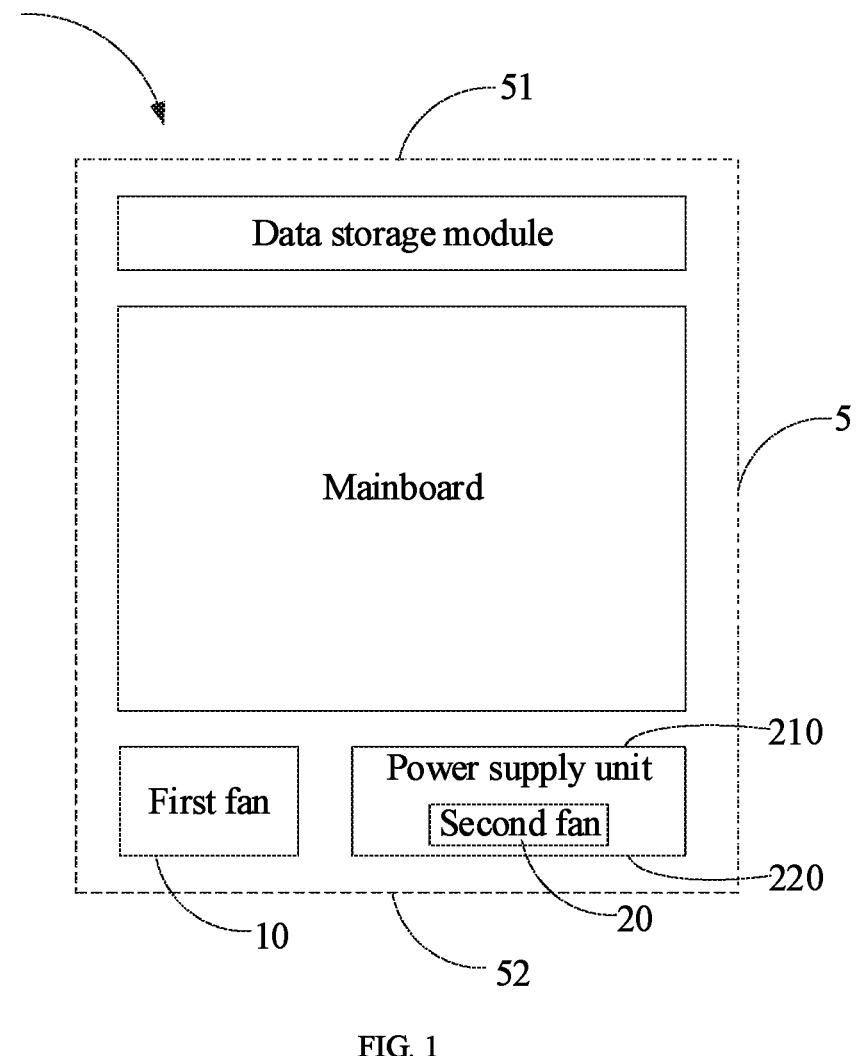
FIG. 1 is a schematic structural diagram of an electronic device in a heat dissipation method for an electronic device according to an embodiment of the present disclosure.

The present disclosure will be further described in detail below in conjunction with the accompanying drawings and embodiments. It should be understood that the specific embodiments described here are only used to explain the present disclosure, but not to limit the present disclosure. In addition, it should be noted that, for the convenience of description, only part of structures related to the present disclosure are shown in the drawings but not all structures.

The term "and/or" in the description is only a way to describe an association relationship between associated objects, which means that there can be three relationships. For example, A and/or B can represent the following three cases: the presence of A alone, the simultaneous presence of A and B, and the presence of B alone.

The terms "first", "second", etc., in the specification and figures of the present disclosure are used to distinguish different objects, or to distinguish different processes for the same object, rather than to describe a specific sequence of objects.

In addition, the terms "include" and "have" in the description of the present disclosure and any variations thereof are intended to cover non-exclusive inclusion. For example, a process, method, system, product, or device that includes a series of steps or units is not limited to the listed steps or units, but may optionally include other unlisted steps or units, or may also optionally include other steps or elements inherent to the process, method, product, or device.

It should be mentioned before discussing the exemplary embodiments in more detail that some of the exemplary embodiments are described as processes or methods depicted as flowcharts. Although the flowcharts describe various operations (or steps) as sequential processing, many of the operations may be performed in parallel, concurrently, or simultaneously. In addition, the order of the operations may be rearranged. The process may be terminated when the operations thereof are complete, but may also have additional steps not included in the figures. The process may correspond to methods, functions, protocols, subroutines, sub-programs, or the like. In addition, the embodiments and the features in the embodiments of the present disclosure can be combined with each other without conflict.

It should be noted that, in the embodiments of the present disclosure, the terms such as "exemplary", "for example", etc., are used as examples, illustrations or explanations. Any embodiment or design solution described as "exemplary" or "for example" in the embodiments of the present disclosure should not be interpreted as being preferred or more advantageous than other embodiments or design solutions. Specifically, the use of the terms such as "exemplary" or "for example" is intended to present related concepts in a specific manner.

In the description of the present disclosure, unless otherwise defined, "multiple" means two or more.

In some electronic devices, such as servers known to the applicant, a system fan is arranged at the front side of the chassis to intake airflow into the chassis to cool electronic modules or devices such as the motherboard, solid-state disk, or function expansion card, etc. Alternatively, in some servers, a system fan is arranged at the rear side of the chassis, and an air deflector is arranged at the front side of the chassis so that airflow enters the chassis and passes through the motherboard, solid-state disk, or function expansion card, etc., in front of the system fan in a pumping manner.

However, for the existing structure in which the system fan is arranged at the rear side of the chassis, a low-pressure area will be formed in front of the system fan. Since the power supply unit is arranged near the system fan and in the same plane as the system fan, the air inlet of the power supply unit is located in the low-pressure area formed by the system fan, while the air outlet of the power supply unit is located at the rear of the chassis with a higher air pressure. When the system fan operates at a high load, for the power supply unit, the airflow is easy to flow from the air outlet to the air inlet, causing the airflow to flow back.

Since the server with the rear-mounted system fan generates air backflow in the power supply unit, the temperature of the airflow at the air inlet of the power supply unit increases. In existing heat dissipation methods for the server, the server increases the number of revolutions (load) of the system fan when it detects that the temperature of the airflow at the air inlet of the power supply unit has increased, which may worsen the problem of air backflow in the power supply unit. In addition, increasing the speed of the system fan further reduces the pressure inside the chassis due to the large increase in the airflow rate, causing the hot air outside the chassis to enter the chassis again, resulting in a deterioration of the heat dissipation efficiency of the server.

FIG. 1 is a schematic structural diagram of a server in a heat dissipation method for an electronic device according to an embodiment of the present disclosure. As shown in FIG. 1, a server 1 includes a chassis 5 and multiple first fans 10. The first fans 10 are arranged on the rear side of the chassis 5. A first air inlet 51 and at least one air deflector (not shown) are arranged on the front side of the chassis 5, and a first air outlet 52 is arranged on the rear side of the chassis 5. A mainboard and a data storage module (DSM) are arranged in front of the first fans 10. The mainboard includes a central processing unit and a memory. The central processing unit of the mainboard and the DSM generate heat during operation, causing the temperature to increase. The first fans 10 rotate to generate a first airflow. The first airflow enters the chassis 5 from the first air inlet 51, flows through the DSM and the mainboard, and is discharged from the first air outlet 52 to dissipate heat from the electronic components of the DSM and the mainboard in the form of heat convection. The first air inlet 51, the first air outlet 52, and the heat-generating electronic components are each provided with a temperature sensor for measuring a first airflow temperature at the first air inlet 51, a second airflow temperature at the first air outlet 52, and a temperature at the heat-generating electronic components.

Multiple power supply units are arranged on one side, such as the right side, of the first fans 10. Each power supply unit includes a second fan 20 therein. Each power supply unit includes a second air inlet 210 and a second air outlet 220. The second air outlet 220 is close to the first air outlet 52 of the chassis 5. A temperature sensor is arranged at the second air inlets 210 for measuring a third airflow temperature at the second air inlets 210 of the power supply units, and a temperature sensor is arranged at the second air outlets 220 for measuring a fourth airflow temperature at the second air outlets 220 of the power supply units. The temperature sensors in this embodiment are thermocouples.

It should be understood that the number of the fans and the power supply units are not limited in the present disclosure.

Figure 2:
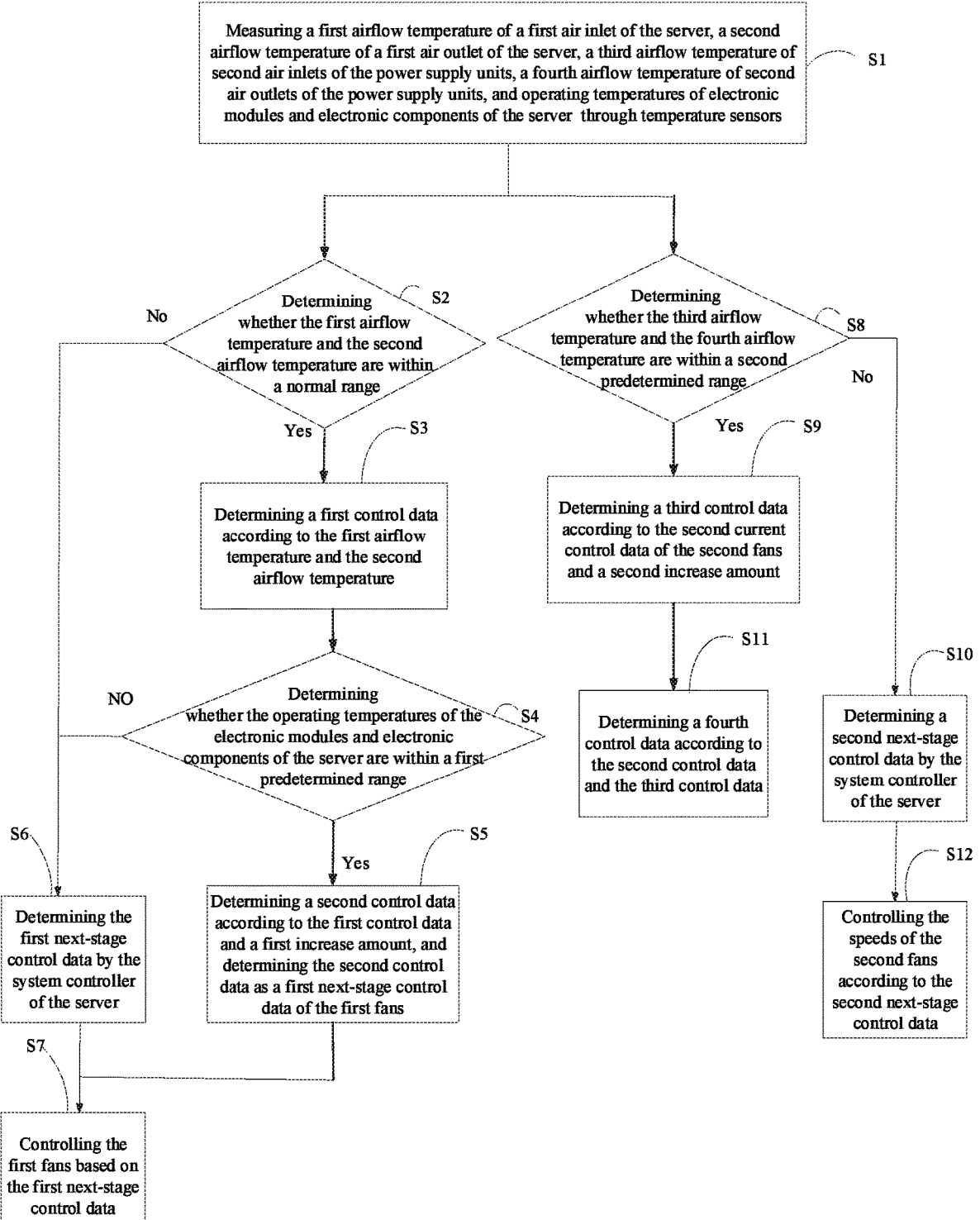
FIG. 2 is a flow chart of a heat dissipation method for an electronic device according to an embodiment of the present disclosure.

FIG. 2 is a flow chart of a heat dissipating method for an electronic device according to an embodiment of the present disclosure. In this embodiment, the method is applied to a server with a rear-mounted fan. It should be understood that, in other embodiments, the heat dissipating method for the electronic device may also be applied to other electronic devices having at least one first fan and at least one second fan, and is not limited to the server. As shown in FIG. 2, the heat-dissipating method for the electronic device in this embodiment includes three control links.

The first control link is a control link for controlling the temperature of the electronic modules and electronic components of a server.

In step S1, a first airflow temperature at a first air inlet of the server, a second airflow temperature at a first air outlet of the server, a third airflow temperature at second air inlets of the power supply units, a fourth airflow temperature at second air outlets of the power supply units, and operating temperatures of electronic modules and electronic components of the server are measured through temperature sensors.

In step S2, it is determined whether the first airflow temperature and the second airflow temperature are within a normal range.

If both the first airflow temperature and the second airflow temperature are within the normal range, step S3 is performed; otherwise, step S6 is performed.

In step S3, a first control data is determined according to the first airflow temperature and the second airflow temperature.

Specifically, in the case that the first airflow temperature at the first air inlet 51 and the second airflow temperature at the first air outlet 52 are within the normal range, according to the operating state of each electronic component, an adjustment control data of each electronic component is determined according to a current adjustment control data and an adjustment amount. Specifically, the adjustment control data is obtained by adding the adjustment amount to the current adjustment control data, that is, $PWM_{i,t}=PWM_{i,t-1}+\delta PWM_{i,t-1}$. For example, if the adjustment amount is 5% of a target adjustment control data, the adjustment control data is obtained by adding the adjustment of 5% to the current adjustment control data. PWMi is the adjustment control data of the i-th electronic component, i ranges from 1 to n, and n is the number of the heat-generating electronic modules or electronic components in the server 1. The first control data is the maximum value of the adjustment control data $PWM_{0,t}$, $PWM_{1,t}$, $PWM_{2,t}$, $PWM_{3,t}$, ... $PWM_{i,t}$ ... $PWM_{n,t}$ of the first fans 10 in the condition that all electronic components do not overheating, where $PWM_{0,t}$ represents the control data of the first fan 10 in the case that all non-PID controlled electronic components or electronic modules in the server 1 do not overheating.

The second control link is a control link for controlling the temperature of the electronic modules and electronic components of the server without generating air backflow in the power supply units.

In step S4, it is determined whether the operating temperatures of the electronic modules and electronic components of the server are within a first predetermined range.

If the operating temperatures of the electronic modules and electronic components of the server 1 are within the first predetermined range, step S5 is performed. If the operating temperatures of the electronic modules and electronic components of the server 1 exceed the first predetermined range, step S6 is performed.

In step S5, a second control data is determined according to the first control data and a first increment, and the second control data is determined as a first next-stage control data of the first fans.

Specifically, the second control data can be obtained by adding the first increment to the first control data, that is, $PWMB_{t}=PWMA_{t}+\delta PWMB_{t}$, where PWMB is the second control data, $PWMA_{t}$ is the first control data, and $\delta PWMB_{t}$ is the first increment. The first increment is a positive value or a negative value.

Step S7 is performed after the step S5.

In step S6, the first next-stage control data is determined by the system controller of the server.

Specifically, when the first airflow temperature at the first air inlet 51, the second airflow temperature at the first air outlet 52, and the operating temperatures of the electronic modules and electronic components of the server 1 exceed the first predetermined range, i.e., when the electronic modules or electronic components are in an overheating state due to changes in operating state, the first next-stage control data can be determined by the system controller of the server 1.

In step S7, the first fans are controlled based on the first next-stage control data.

Specifically, when the speeds of the first fans 10 are controlled by the first next-stage control data, the third airflow temperature at the second air inlets 210 of the power supply units is lower than the fourth airflow temperature at the second air outlets 220 of the power supply units, in other words, the operation of the first fans 10 will not cause air backflow in the power supply units, and the server 1 is cooled under this condition.

The third control link is a control link for controlling the temperature of the power supply units.

In step S8, it is determined whether the third airflow temperature and the fourth airflow temperature are within a second predetermined range.

If the third airflow temperature at the second air inlet 210 and the fourth airflow temperature at the second air outlet 220 are within the second predetermined range, step S9 is performed. If the third airflow temperature at the second air inlet 210 and the fourth airflow temperature at the second air outlet 220 exceed the second predetermined range, step S10 is performed.

In step S9, a third control data is determined according to the second current control data of the second fans and a second increment.

Specifically, the third control data is determined by adding the second increment to the second current control data, i.e., $PWMC_{t}=PWMC_{t-1}+\delta PWMC_{t-1}$, where $PWMC_{t}$ is the third control data, and $PWMC_{t-1}$ is the second current control data.

Step S11 is performed after the step S9.

In step S10, a second next-stage control data is determined by the system controller of the server.

Specifically, the second next-stage control data is determined by the system controller of the server 1 if the third airflow temperature at the second air inlet 210 exceeds the second predetermined range.

Step S12 is performed after the step S10.

In step S11, a fourth control data is determined according to the second control data and the third control data.

In this embodiment, the fourth control data is the larger one of the second control data and the third control data, $PWMD=max\{PWMB, PWMC_{t}\}$, where PWMD is the fourth control data.

The fourth control data can be used as the second next-stage control data of the second fans 20.

In step S12, the speeds of the second fans are controlled according to the second next-stage control data.

Specifically, when the speeds of the second fans 20 are controlled by the second next-stage control data, the third airflow temperature at the second air inlets 210 of the power supply units is lower than the fourth airflow temperature at the second air outlets 220 of the power supply units. In other words, the second fans 20 operate to dissipate heat from the power supply units under the condition that air backflow is not generated in the power supply units.

The heat dissipation method for the electronic device may be executed by a control chip of the electronic device.

The heat dissipation method for the server provided by the present disclosure includes three links. The first link is the control data of the first fans determined corresponding to the temperature control of the electronic components of the server, the second link is the control data determined by considering that the air backflow is not generated in the power supply units, and the third link is the control data of the second fans determined by feeding back the control data of the first fans to the power supply units and considering the temperature control of the power supply units. In the case that the air backflow is not generated in the power supply units, the speed control of the first fans of the server system and the second fans of the power supply units is realized.

The heat dissipation method for the server provided by the present disclosure realizes the control of the second fans of the power supply units, preventing the power supply units from overheating, reducing power consumption waste, and ensuring safer temperature control. In the normal or abnormal speed control stage, the air backflow and the blade reversal of the second fans in the power supply units are prevented, which in turn avoids the reduction of the heat dissipation efficiency of the system and further avoids the waste of energy.

In addition, the acquisition, storage, use, and processing of the data in the technical solution of the present disclosure all comply with the relevant provisions of national laws and regulations.

It should be noted that the above are only preferred embodiments and technical principles used in the present disclosure. Those skilled in the art will understand that the present disclosure is not limited to the specific embodiments herein. Various obvious changes, rearrangement and replacement can be made by those skilled in the art without departing from the protection scope of the present disclosure. Therefore, although the present disclosure has been described in detail through the above embodiments, the present disclosure is not limited to the above embodiments and can also include more other equivalent embodiments without departing from the concept of the present disclosure, and the scope of the present disclosure is determined by the scope of the appended claims.

What is claimed is:

1. A heat dissipation method for an electronic device, the electronic device comprising at least one first fan and at least one power supply unit, the at least one first fan being configured to generate an airflow passing through the electronic device, the at least one power supply unit comprising a second fan, the second fan being configured to generate an airflow passing through the at least one power supply unit, a speed of the at least one first fan being controlled according to a first current control data, a speed of the at least one second fan being controlled according to a second current control data, wherein the method comprises:

detecting a first airflow temperature at a first air inlet of the electronic device and a second airflow temperature at a first air outlet of the electronic device;

determining a first control data according to the first airflow temperature and the second airflow temperature;

detecting operating temperatures of electronic components of the at least one power supply unit of the electronic device;

determining a second control data according to the first control data and a first increment if the operating temperatures of the electronic components are within a first predetermined range;

determining the second control data as a first next-stage control data of the at least one first fan, such that, when the speed of the at least one first fan is controlled by the first next-stage control data, a third airflow temperature at a second air inlet of the at least one power supply unit is lower than a fourth airflow temperature at a second air outlet of the at least one power supply unit;

detecting the third airflow temperature at the second air inlet of the at least one power supply unit and the fourth airflow temperature at the second air outlet of the at least one power supply unit;

determining a third control data according to the second current control data and a second increment if the third airflow temperature at the second air inlet of the at least one power supply unit is within a second predetermined range;

determining a fourth control data according to the second control data and the third control data;

determining the fourth control data as a second next-stage control data of the at least one second fan, such that, when a speed of the at least one second fan is controlled by the second next-stage control data, the third airflow temperature at the second air inlet of the at least one power supply unit is lower than the fourth airflow temperature at the second air outlet of the at least one power supply unit.

2. The heat dissipation method for the electronic device according to claim 1, wherein the first next-stage control data is determined by a system controller of the electronic device if the operating temperatures of the electronic components exceed the first predetermined range.

3. The heat dissipation method for the electronic device according to claim 1, wherein the second next-stage control data is determined by a system controller of the electronic device if the third airflow temperature at the second air inlet of the at least one power supply unit exceeds the second predetermined range.

4. The heat dissipation method for electronic device according to claim 1, wherein the first control data is a maximum value of adjustment control data of the at least one first fan in a condition that all electronic components do not overheating, and the adjustment control data of each of the electronic components is determined according to a current adjustment control data and an adjustment amount.

5. The heat dissipation method for the electronic device according to claim 1, wherein the second control data is determined by increasing the first control data by the first increment, and the first increment is a positive value or a negative value.

6. The heat dissipation method for the electronic device according to claim 1, wherein the third control data is determined by increasing the second current control data by the second increment.

7. The heat dissipation method for the electronic device according to claim 1, wherein the fourth control data is a larger one of the second control data and the third control data.

8. The heat dissipation method for the electronic device according to claim 1, wherein the at least one first fan is arranged at a rear side of a chassis of the electronic device, and the at least one power supply unit and the at least one first fan are arranged at a same horizontal position.

9. An electronic device, comprising at least one first fan and at least one power supply unit, the at least one first fan being configured to generate an airflow passing through the electronic device, the at least one power supply unit comprising a second fan, the second fan being configured to generate an airflow passing through the at least one power supply unit, a speed of the at least one first fan being controlled according to a first current control data, and a speed of the at least one second fan being controlled according to a second current control data, wherein the electronic device further comprises a control chip configured to perform a heat dissipation method for the electronic device, the method comprising:

detecting a first airflow temperature at a first air inlet of the electronic device and a second airflow temperature at a first air outlet of the electronic device;

determining a first control data according to the first airflow temperature and the second airflow temperature;

detecting operating temperatures of electronic components of the at least one power supply unit of the electronic device;

determining a second control data according to the first control data and a first increment if the operating temperatures of the electronic components are within a first predetermined range;

determining the second control data as a first next-stage control data of the at least one first fan, such that, when the speed of the at least one first fan is controlled by the first next-stage control data, a third airflow temperature at a second air inlet of the at least one power supply unit is lower than a fourth airflow temperature at a second air outlet of the at least one power supply unit;

detecting the third airflow temperature at the second air inlet of the at least one power supply unit and the fourth airflow temperature at the second air outlet of the at least one power supply unit;

determining a third control data according to the second current control data and a second increment if the third airflow temperature at the second air inlet of the at least one power supply unit is within a second predetermined range;

determining a fourth control data according to the second control data and the third control data;

determining the fourth control data as a second next-stage control data of the at least one second fan, wherein when a speed of the at least one second fan is controlled by the second next-stage control data, the third airflow temperature at the second air inlet of the at least one power supply unit is lower than the fourth airflow temperature at the second air outlet of the at least one power supply unit.

10. The electronic device according to claim 9, wherein the first next-stage control data is determined by a system controller of the electronic device if the operating temperatures of the electronic components exceed the first predetermined range.

11. The electronic device according to claim 9, wherein the second next-stage control data is determined by a system controller of the electronic device if the third airflow temperature at the second air inlet of the at least one power supply unit exceeds the second predetermined range.

12. The electronic device according to claim 9, wherein the first control data is a maximum value of adjustment control data of the at least one first fan in a condition that all electronic components do not overheating, and the adjustment control data of each of the electronic components is determined according to a current adjustment control data and an adjustment amount.

13. The electronic device according to claim 9, wherein the second control data is determined by increasing the first control data by the first increment, and the first increment is a positive value or a negative value.

14. The electronic device according to claim 9, wherein the third control data is determined by increasing the second current control data by the second increment.

15. The electronic device according to claim 9, wherein the fourth control data is a larger one of the second control data and the third control data.

16. The electronic device according to claim 9, wherein the at least one first fan is arranged at a rear side of a chassis of the electronic device, and the at least one power supply unit and the at least one first fan are arranged at a same horizontal position.

* * * * *